(12) United States Patent
Colombo

(10) Patent No.: US 7,015,534 B2
(45) Date of Patent: Mar. 21, 2006

(54) ENCAPSULATED MOS TRANSISTOR GATE STRUCTURES AND METHODS FOR MAKING THE SAME

(75) Inventor: Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/686,011

(22) Filed: Oct. 14, 2003

(65) Prior Publication Data

US 2005/0079696 A1 Apr. 14, 2005

(51) Int. Cl.
*H01L 29/76* (2006.01)
*H01L 29/788* (2006.01)

(52) U.S. Cl. .................. 257/314; 257/315; 257/316

(58) Field of Classification Search ............... 257/314, 257/315, 316, 321, 384, 407, 412, 758
See application file for complete search history.

(56) References Cited

U.S. PATENT DOCUMENTS

| | | | |
|---|---|---|---|
| 4,628,588 A | 12/1986 | McDavid | |
| 4,641,417 A | 2/1987 | McDavid | |
| 4,672,419 A | 6/1987 | McDavid | |
| 4,954,867 A | 9/1990 | Hosaka | |
| 5,633,522 A | 5/1997 | Dorleans et al. | |
| 5,723,893 A | 3/1998 | Yu et al. | |
| 5,937,315 A | 8/1999 | Xiang et al. | |
| 6,218,276 B1 | 4/2001 | Liu et al. | |
| 6,265,297 B1 | 7/2001 | Powell | |
| 6,274,900 B1 * | 8/2001 | San et al. | 257/314 |
| 6,376,342 B1 * | 4/2002 | Tseng | 438/517 |
| 6,383,870 B1 | 5/2002 | San et al. | |
| 6,410,967 B1 | 6/2002 | Hause et al. | |
| 6,432,817 B1 | 8/2002 | Bertrand et al. | |
| 6,602,781 B1 | 8/2003 | Xiang et al. | |
| 6,617,624 B1 | 9/2003 | Powell | |

OTHER PUBLICATIONS

"An Investigation of Molybdenum Gate for Submicrometer CMOS", Robert F. Kwasnick, Edmund B. Kaminsky, Paul A. Frank, Gerhard A Franz, Kenneth J. Polasko, Richard J. Saia and Thomas B. Gorczya, IEEE Transactions on Electron Devices, vol. 35, No. 9, Sep., 1988, pp. 1432-1438.

"FinFET Process Refinements for Improved Mobility and Gate Work Function Engineering" , Yang-Kyu Choi, Leland Chang, Pushkar Ranade, Jeong-Soo Lee, Daewon Ha, Sriram Balasubramanian, Aditya Agarwal, Mike Ameen, Tsu-Jae King and Jeffrey Bokor, IEEE, 2002, 4 pgs.

"Silicon Processing for the VLSI Era, vol. 2: Process Integration", Stanley Wold Ph.D., Copyright 1990, Lattice Press, 7 pgs.

"Electrical Characteristics of $TiB_2$ for ULSI Applications", Chang Sik Choi, Qingfeng Want, Carlton M. Osburn, Gary A. Ruggles and Ayan S. Shah, IEEE transactions on Electron Devices, vol. 39, No. 10, Oct., 1992, pp. 2341-2345.

(Continued)

*Primary Examiner*—Walter L. Lindsay, Jr.
(74) *Attorney, Agent, or Firm*—Rose Alyssa Keagy; W. James Brady, III; Frederick J. Telecky, Jr.

(57) ABSTRACT

Transistor gate structures, encapsulation structures, and fabrication techniques are provided, in which sidewalls of patterned gate structures are conditioned by nitriding the sidewalls of the gate structure, and a silicon nitride encapsulation layer is formed to protect the conditioned sidewalls during manufacturing processing. The conditioning and encapsulation avoid oxidation of gate stack layers, particularly metal gate layers, and also facilitate repairing or restoring stoichiometry of metal and other gate layers that may be damaged or altered during gate patterning.

5 Claims, 5 Drawing Sheets

OTHER PUBLICATIONS

"Mo$_2$N/Mo Gaff Mosfets", Nanjin J. Kim and Dale M. Brown, IEEE, 1982, 4 pgs.

"Application of MoSi$_2$ to the Double-Level Interconnections of I$^2$L Circuits", Yoshitaka Sasaki, Osamu Ozaza and Shuichi Kameyama, IEEE Transactions on Electron Devices, vol. ED-27, No. 8, Aug., 1980, 5 pgs.

"Work Function Controlled Silicide Technology for Submicron CMOS", Masakazu Kakumu and Kazuhiko Hashimoto, No Source or Date Available, pp. 30-31.

"Refractory Metal Silicide/N+ Polysilicon in CMOS/SOS", B.C. Leung and J.S. Maa, No Source or Date Available, pp. 827-830.

"Fabrication of Mo-Gate/Ti-Silicide-Clas-Moat MOS Devices by Use of Multilayer-Glass Depositions", J.M. McDavid, IEEE Electron Device Letters, vol. EDL-5, No. 9, Sep., 1984, pp. 374-375.

"Lightly Impurity Doped (LD) Mo Silicide Gate Technology", Masakazu Kakumu and Jun'ichi Matsunaga, IEEE, 195, 4 pgs.

* cited by examiner

ENCAPSULATED MOS TRANSISTOR GATE STRUCTURES AND METHODS FOR MAKING THE SAME

FIELD OF INVENTION

The present invention relates generally to semiconductor devices and more particularly to encapsulation and conditioning structures and techniques for MOS transistor gates.

BACKGROUND OF THE INVENTION

Metal-oxide-semiconductor field-effect transistors (MOSFETs) are widely used in the electronics industry for switching, amplification, filtering, and other tasks related to both analog and digital electrical signals. MOS transistors include a gate dielectric overlying a channel region of a semiconductor substrate and a gate electrode situated above the gate dielectric. Source and drain regions are formed in the substrate on either side of the channel. Gate dielectric and gate electrode layers (e.g., silicon dioxide ($SiO_2$) and poly-silicon, respectively) are initially formed over the substrate and the gate electrode is patterned to form a gate structure overlying the channel region of the substrate, after which the source/drain regions are doped with n or p-type impurities.

FIG. 1 illustrates a portion of a fabrication process flow 2 relating to gate structure fabrication and FIGS. 2A–2C illustrate a MOS transistor 50 at different stages of fabrication having poly-silicon gate electrode material and $SiO_2$ gate dielectric material. At step 4 in the process 2, a gate dielectric is formed over the substrate, after which poly-silicon gate electrode material is deposited at 6. As shown in FIG. 2A, a thin gate dielectric oxide 62 (e.g., $SiO_2$) is formed over a silicon substrate 54 between field oxide structures 56, and poly-silicon material 68 is formed over the dielectric 62 and the field oxide 56. A gate etch process 58 is then performed using a mask 59 in FIG. 2A (step 8 in FIG. 1) to form a patterned gate structure as shown in FIG. 2B. A drain extension implantation is performed (step 10 in FIG. 1) to introduce dopants into source/drain regions 60 outlying the patterned gate structure. Any gate dielectric material 62 remaining over the source/drains 60 that may have been damaged by the etching 58 or the dopant implantation is removed (e.g., stripped) after the implantation.

A reoxidation process 61 is performed (step 12 in FIG. 1) to grow or deposit an oxide encapsulation layer 70 over the top and sidewalls of the patterned gate structure, and over the source/drain regions 60 of the substrate 54, as shown in FIG. 2B. This reoxidation 61 serves to reoxidize the upper surface of the substrate 54 in the source/drain regions 60. The reoxidation 61 also encapsulates the patterned gate structure by forming $SiO_2$ 70 over the top and sidewalls of the poly-silicon gate electrode 68 and along any exposed portions of the gate dielectric 62 under the electrode 68. The encapsulation layer 70 may inhibit boron dopant out-diffusion from the p-doped poly-silicon gate electrodes 68 during subsequent formation of inter-level dielectrics, reduce gate-to-drain overlap capacitance, and strengthen the gate dielectric 62 at the edge of the poly-silicon gate electrode 68. As shown in FIG. 2C, sidewall spacers 72 are then formed along the sidewalls of the patterned encapsulated gate structure (step 14 in FIG. 1), and deeper source/drain implants are performed to further define the source/drains 60. The source/drains are silicided to form source/drain contacts 74 and the top of the poly-silicon gate electrode 68 is silicided to form a gate contact 66, after which interconnect and other back-end fabrication processing (not shown) is performed.

In operation, the gate electrode 68 is energized to create an electric field in the channel region of the substrate 54, thereby rendering a portion of the channel conductive and allowing electrons to travel through the channel between the source/drains 60. The threshold voltage (Vt) of the transistor 50 is the gate voltage value required to render the channel conductive by formation of an inversion layer at the surface of the semiconductor channel. The threshold voltage Vt is dependent upon the flat-band voltage, which in turn depends on the work function difference between the gate and the substrate materials, as well as on surface charge. To set Vt values, the work functions of the poly-silicon gate electrodes 68 and the corresponding channel material (e.g., silicon) are independently tuned or adjusted for p-channel and n-channel transistors 50 (PMOS and NMOS) through gate and channel doping (e.g., gate and channel engineering), respectively. Because the work function of poly-silicon can be easily changed while being rendered conductive by appropriate dopant implantation, poly-silicon has thusfar been widely employed in forming gate electrodes 68, particularly in fabricating complementary MOS (CMOS) devices having both NMOS and PMOS transistors 50.

The gate dielectric 62 is an insulator material, typically $SiO_2$ or other dielectric, that operates to prevent large currents from flowing from the gate electrode 68 into the channel when a gate voltage is applied, and allows an applied gate voltage to establish an electric field in the channel region in a controllable manner. Continuing trends in semiconductor product manufacturing include reduction in electrical device feature sizes (scaling), as well as improvements in device performance in terms of device switching speed and power consumption. MOS transistor performance may be improved by reducing the distance between the source and the drain regions 60 under the gate electrode of the device, known as the gate or channel length, and by reducing the thickness of the layer of $SiO_2$ gate dielectric 62 that is formed over the semiconductor surface. However, limitations on the extent to which $SiO_2$ gate dielectric thicknesses can be reduced have lead to increased usage of so-called high-k dielectric materials having dielectric constants greater than that of $SiO_2$. High-k gate dielectrics can be formed in a thicker layer than scaled $SiO_2$ while producing equivalent field effect performance. However, certain high-k dielectric materials may be damaged during gate etching.

Another shortcoming of the conventional MOS transistor 50 is known as poly-silicon depletion. Poly-silicon depletion occurs when annealing or other thermal processing following implantation of dopants into poly-silicon gate electrode material 68 is insufficient to activate the implanted impurities at the poly-silicon gate dielectric interface 68. In this situation, a bottom portion of the poly-silicon gate electrode 68 near the gate dielectric 62 is "depleted" of charges, and acts as an insulator. The depleted portion of the gate contact and the gate dielectric operate as series connected capacitors, resulting in a reduced effective gate capacitance, which reduces the drive current capability of the device. Consequently, poly-silicon depletion causes reduction in device performance and leads to poor unscalable devices, where poly-silicon depletion problems become more significant as device dimensions continue to be scaled.

Accordingly, attention has recently been directed to using metal gate electrodes in MOS transistors to avoid the effects of poly-silicon depletion. However, metal gate materials may also be damaged by gate patterning (e.g., etching, wet cleans, etc.) operations, wherein the use of conventional reoxidation encapsulation techniques can actually degrade the damaged metal. Furthermore, use of traditional oxidation processes in forming an encapsulation layer for patterned metal gate structures may itself cause unwanted oxidation of the metal material, leading to further degradation of device performance. For example, exposing a gate stack structure having a titanium nitride (TiN) layer to a conventional reoxidation process causes formation of titanium oxynitride (TiON) along the gate sidewall, which effectively increases the capacitance of the gate electrode by formation of a dielectric in a portion of the gate electrode. Furthermore, as discussed above, traditional reoxidation processes may cause formation of low-k dielectrics along the sidewall of high-k gate dielectric layers in the gate stack. Accordingly, there is a need for improved gate encapsulation structures and techniques by which metal and other gate structures may be encapsulated after patterning.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to conditioning and encapsulating patterned gate structures, including those having metal and/or poly-silicon layers, by which sidewalls damaged during gate etching may be fixed or repaired without creating unwanted oxidation and associated performance degradation.

One aspect of the invention provides transistor gate structures and encapsulation structures therefor, in which a silicon nitride encapsulation layer is provided (e.g., $Si_3N_4$ or other material having silicon and nitrogen components) that is spaced from a patterned gate structure sidewall. A nitrided dielectric is provided between the encapsulation layer and the gate dielectric at the sidewall, and a nitrided material is provided between the encapsulation layer and the gate electrode at the sidewall. The gate electrode may comprise poly-silicon and/or metal material. Where the gate electrode comprises poly-silicon, the nitrided material may comprise silicon nitride between the silicon nitride encapsulation layer and the gate electrode sidewall. In the case where the gate electrode comprises metal, metal aluminide, or metal silicide, the nitrided material may comprise nitrided metal, metal aluminum nitride, or metal silicon nitride between the encapsulation layer and the gate electrode sidewall.

Another aspect of the invention provides methods for fabricating transistor gate structures and for encapsulating a patterned transistor gate structure. The methods comprise nitriding sidewalls of a patterned gate structure, and forming a silicon nitride encapsulation layer along the sidewalls of the gate structure. Nitridation of the patterned sidewalls may be accomplished by any suitable technique, such as exposing the sidewalls to ammonia (e.g., $NH_3$) at a temperature of less than about 1000 degrees C. or by performing a decoupled-plasma-nitridation (DPN) or slot-plane-antenna (SPA) process. The silicon nitride encapsulation layer may be formed using any suitable methods, including exposing the sidewalls to ammonia and silane, wherein the nitridation and encapsulation can be performed in sequence in a single processing chamber.

Where the gate electrode comprises poly-silicon, nitriding the sidewalls may include forming a first silicon nitride at a gate electrode portion of the sidewalls. Where the gate electrode is fabricated using metal, metal aluminide, or metal silicide (alone or in combination with poly-silicon), nitriding the sidewalls may comprise forming a metal nitride at a gate electrode portion of the sidewalls. Where the gate electrode comprises a nitrided metal or nitrided metal silicide, nitriding the sidewalls may fix a stoichiometry of the nitrided metal, metal aluminum nitride, or metal silicon nitride. Where the gate dielectric comprises a nitrided dielectric (e.g., SiON or other dielectric material having a nitrogen content), nitriding the patterned gate sidewalls may comprise fixing a stoichiometry of gate dielectric by renitriding the dielectric at a gate dielectric portion of the sidewalls. In this manner, the nitridation of the patterned sidewalls can be used to repair etch or implantation damage to the gate electrode and/or the gate dielectric before encapsulation by formation of a silicon nitride layer.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
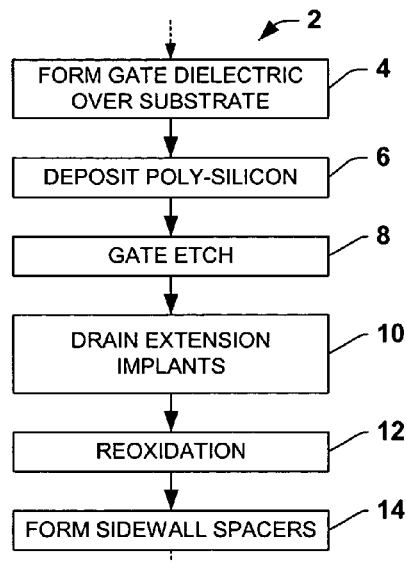
FIG. 1 is a simplified flow diagram illustration a portion of a conventional gate fabrication process.
Figure 2A:
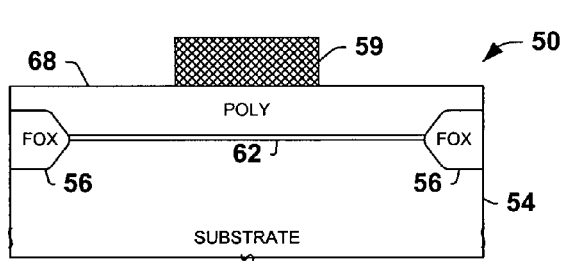
FIGS. 2A–2C are side views of a conventional MOS transistor during fabrication.
Figure 2B:
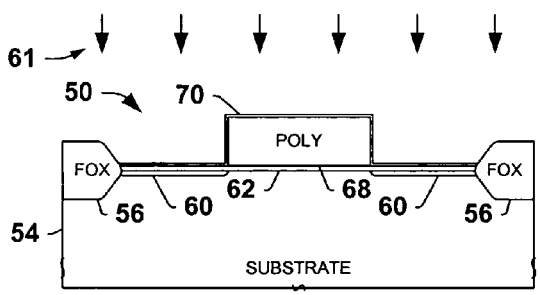
Figure 2C:
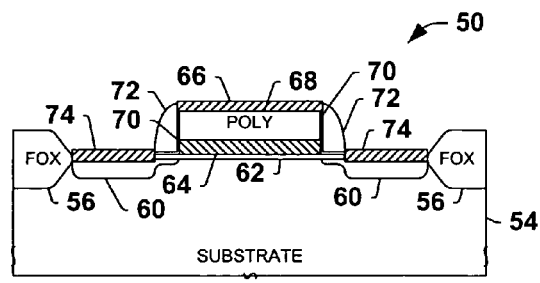

One or more implementations of the present invention will now be described with reference to the attached drawings, wherein like reference numerals are used to refer to like elements throughout, and wherein the illustrated structures are not necessarily drawn to scale. The invention relates to gate stack fabrication where a gate structure is conditioned through nitridation after gate patterning and encapsulated with a silicon nitride layer.

Figure 3:
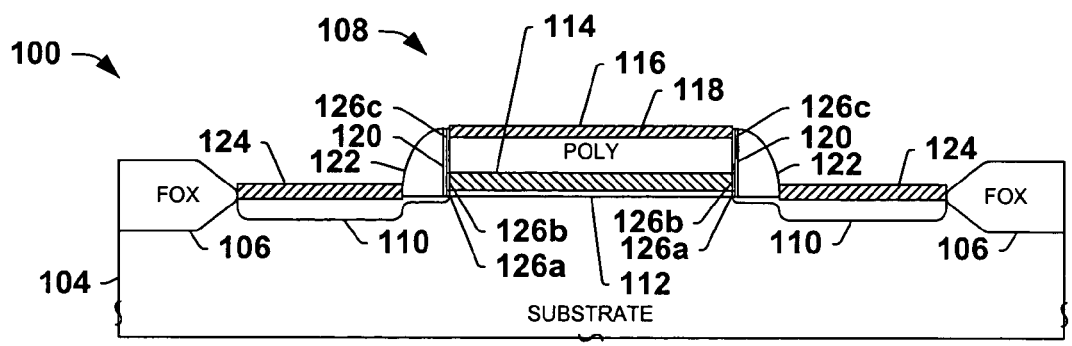
FIG. 3 is a partial side elevation view in section illustrating an exemplary MOS transistor having a gate structure and encapsulation structure in accordance with the present invention.

Referring initially to FIG. 3, a portion of a semiconductor device 100 is illustrated in which an exemplary MOS transistor 108 is formed in accordance with the invention. The device 100 includes a silicon substrate 104 in which field oxide isolation structures 106 are formed, although the invention may be carried out in devices formed using any suitable semiconductor body (e.g., silicon substrates, SOI wafers, epitaxial silicon layers formed above a substrate, etc.) and any suitable isolation structures (e.g., field oxide formed using LOCOS techniques, shallow trench isolations (STI) structures, etc.). The MOS transistor 108 can be an n-channel (NMOS) or a p-channel (PMOS) device, and includes doped source/drains regions 110 at either end of a channel portion of the substrate 104, along with a gate structure formed above the channel. The gate structure includes a gate dielectric 112 formed above the substrate 104 and a multilayer gate electrode comprising a metal electrode portion 114 above the gate dielectric 112 and a poly-silicon electrode portion 118 above the metal 114, where the stack portions 112, 114, and 118 are patterned to include lateral sidewalls.

In accordance with the invention, the transistor 108 comprises silicon nitride encapsulation layers 120 laterally spaced from the gate structure sidewalls. Between the sidewalls and the encapsulation layer 120 is a nitrided dielectric 126a at the sidewall portions of the gate dielectric 112, and nitrided materials 126b and 126c at the sidewall portions of the metal and poly-silicon gate electrode layers 114 and 118, respectively. Sidewall spacers 122 are formed along the encapsulation layer 120 and silicide contacts 124 and 116 are formed over the source/drain regions 110 and the gate poly-silicon 118, respectively.

Any nitride-containing material 126 may be formed between the encapsulation layer 120 and the gate structure sidewalls within the scope of the invention. In addition, any suitable material that includes silicon and nitrogen content may be used to form the encapsulation layer 120. The silicon nitride encapsulation layer 120 and the nitrided materials 126 form an encapsulation structure that conditions or repairs gate sidewall materials that may have been damaged or altered during etching (e.g., fixes stoichiometry through renitridation, etc.) and protects the gate structure during fabrication processing after the gate stack is patterned. In addition, the encapsulation structure avoids potentially damaging oxidation of the sidewall portions of the metal 114 and the gate dielectric 112 that was problematic in traditional reoxidation steps.

In one example, the nitrided material 126c comprises silicon nitride (e.g., $Si_3N_4$ or other material that comprises silicon and nitrogen) between the encapsulation layer 120 and the poly-silicon gate electrode sidewall, formed by nitriding the poly-silicon sidewall after etching and before formation of the encapsulation layer 120. The same nitridation process may be used to form a nitrided metal or nitrided metal silicide 126b between the encapsulation layer 120 and the metal portion of the gate electrode sidewall. For example, the metal gate layer 114 may comprise TiN, where gate etching disrupts the stoichiometry of the TiN material along the etched sidewalls. A nitridation process (e.g., exposure of the etched sidewalls to an ammonia ($NH_3$) environment or other nitridation process such as DPN, SPA, etc.) renitrides the damaged sidewall portions of the metal 114 to reform TiN without adverse oxidation, after which the encapsulation layer 120 is formed.

A nitrided dielectric 126a may be concurrently formed by the same nitridation process, where process nitrogen reacts with a gate dielectric 112 (e.g., SiON) to form a silicon nitride material 126a (e.g., $Si_3N_4$) along the exposed sidewalls of the gate dielectric 112 before the encapsulation layer 120 is formed. In one implementation described below, the encapsulation layer 120 may be formed after the nitrided materials 126 by exposing the device 100 to a chemical vapor deposition (CVD) process including ammonia and silane gases ($NH_3$ and $SiH_4$). The gate electrode is a bilayer 114,118 in the illustrated device 100, although nitrided materials 126 and silicon nitride encapsulation layers may be formed in association with any type of transistor gate stack, whether the gate electrode portion thereof is a single layer (e.g., poly-silicon, metal, metal silicide, etc.) or a multi-layer electrode structure.

Further, the invention may be employed in association with gate stacks comprising any gate dielectric portions 112, including single and multiple-layer gate dielectrics of any suitable dielectric materials, such as $SiO_2$, SiON, high-k dielectrics, and stacks or combinations thereof, including but not limited to binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, ZrAlON, HfAlON, etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

Figure 4:
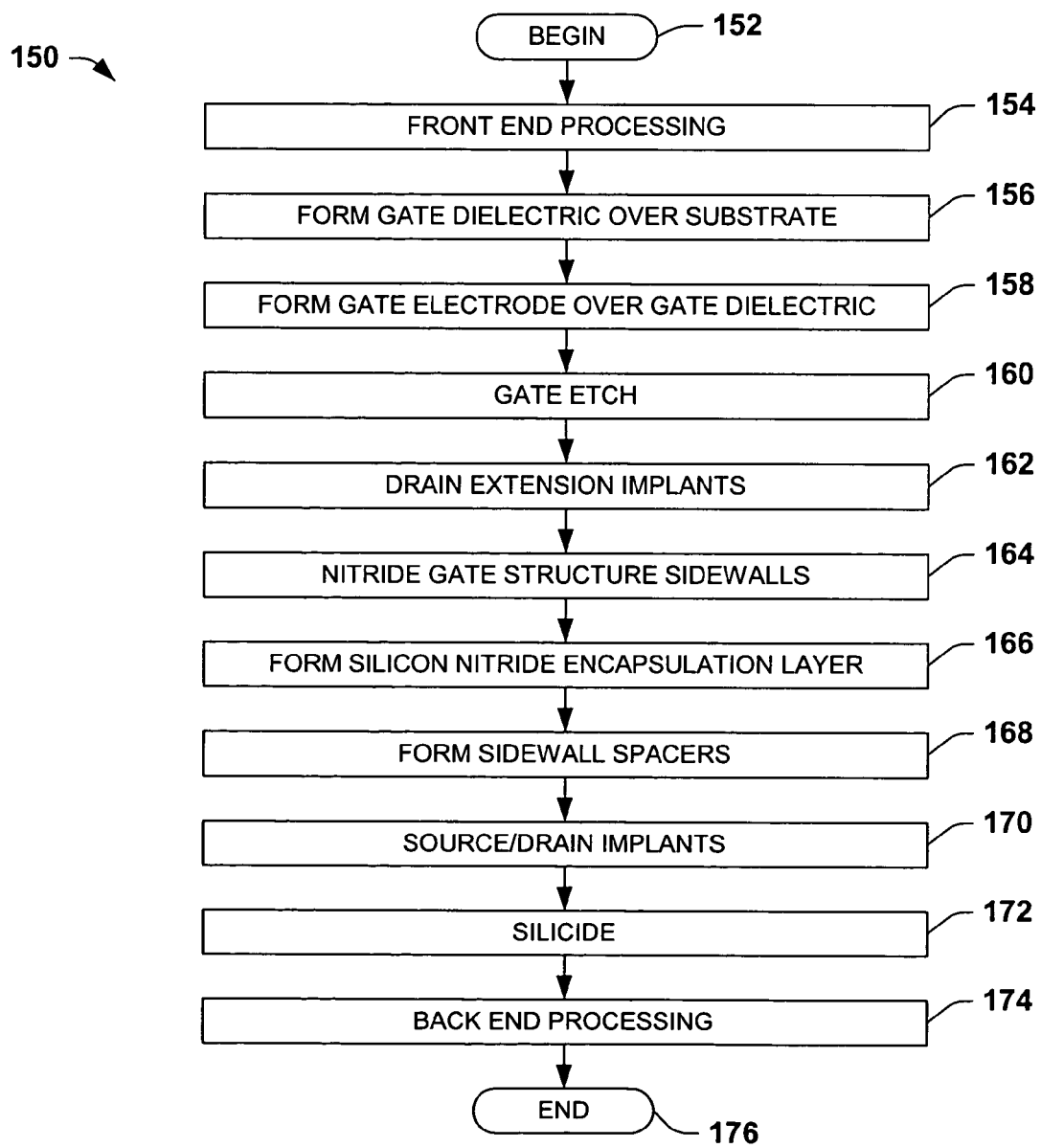
FIG. 4 is a flow diagram illustrating a fabrication process for fabricating a semiconductor device, including gate structure fabrication and encapsulation aspects of the invention.

Referring now to FIGS. 4 and 5A–5L, a method 150 is illustrated in FIG. 4 for fabricating semiconductor devices beginning at 152, including gate stack conditioning and encapsulation techniques in accordance with the present invention. Although the exemplary method 150 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein as well as in association with other structures and devices not illustrated. FIGS. 5A–5L illustrate one such exemplary device 302 processed generally in accordance with the method 150.

Figure 5A:
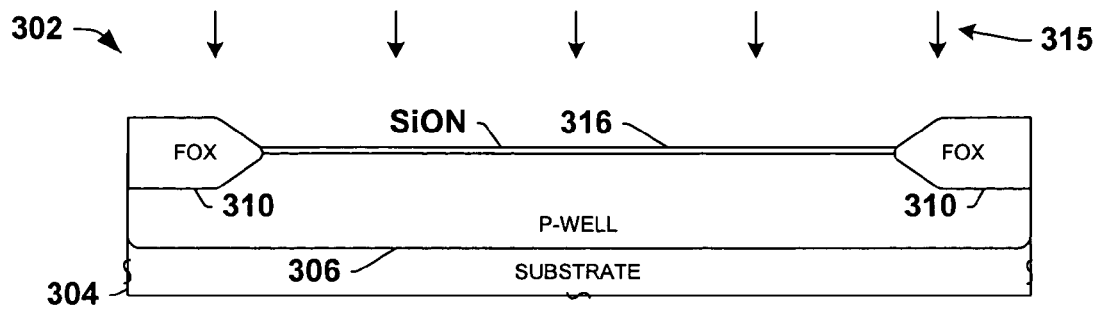
FIGS. 5A–5L are partial side elevation views in section illustrating fabrication of an exemplary MOS transistor having an encapsulated gate structure in accordance with the invention.
Figure 5B:
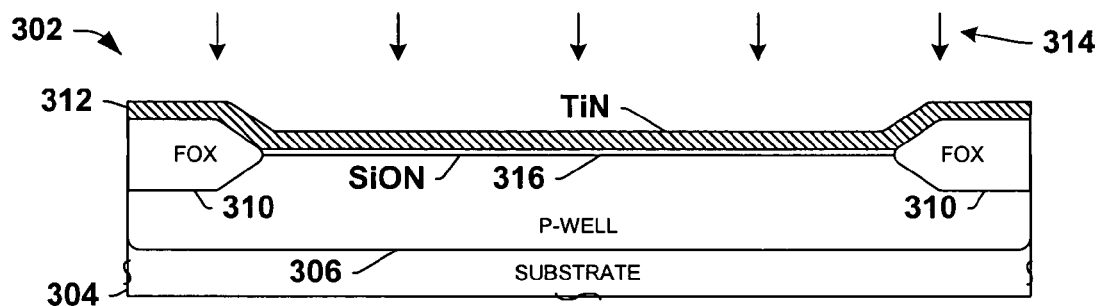
Figure 5C:
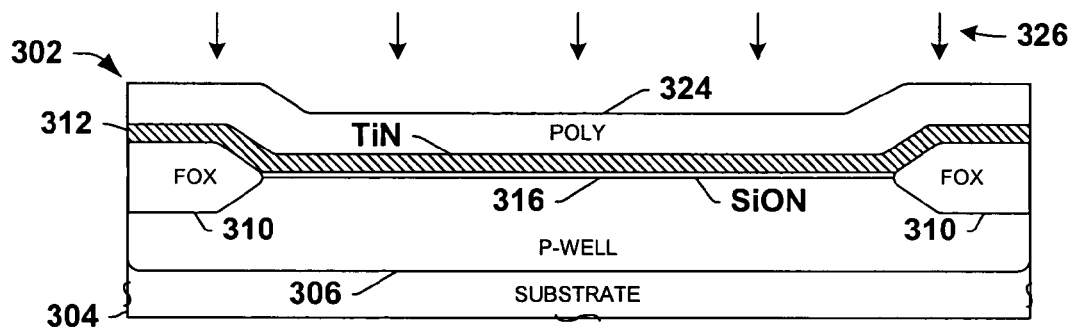

The device 302 of FIG. 5A comprises a silicon substrate semiconductor body 304 with a p-well 306 and field oxide (FOX) isolation structures 310 formed during front-end processing (e.g., at 154 in FIG. 4). A SiON gate dielectric 316 is formed via a deposition process 315 (e.g., at 156 in FIG. 4) over the surface of the substrate 304 in active regions between the FOX isolation structures 310. In FIGS. 5B and 5C, gate electrode material layers are formed above the gate dielectric 316 (158 in FIG. 4), including a TiN layer 312 deposited via a deposition process 314 (FIG. 5B) and a poly-silicon layer 324 deposited via a deposition process 326 (FIG. 5C) over the TiN layer 312. The gate electrode layers 312 and 324 may be formed to any suitable thicknesses using any suitable deposition processes 314 and 326, respectively.

Figure 5D:
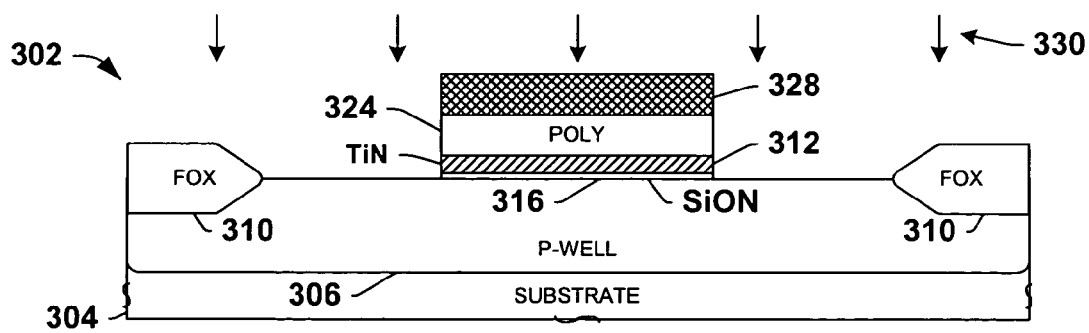
Figure 5E:
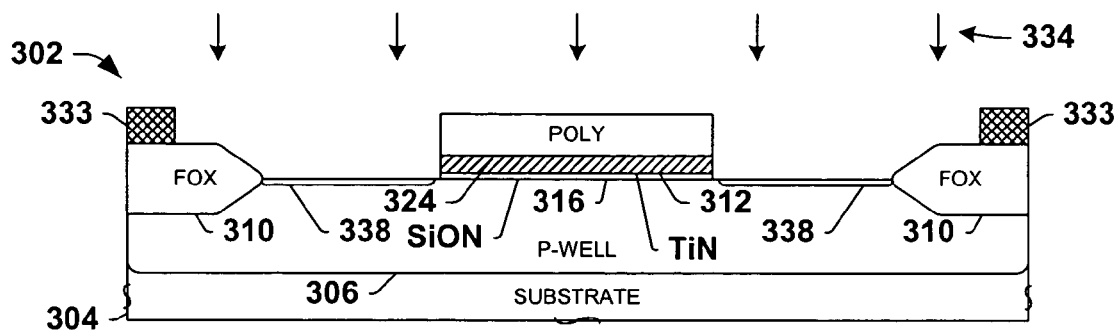

A gate mask 328 is formed in FIG. 5D, and an etch process 330 is performed (160 in FIG. 4) to remove the exposed portions of the gate electrode poly-silicon 324 and TiN 312, as well as the exposed SiON gate dielectric 316, leaving a patterned gate structure with top and sidewall surfaces exposed. Alternatively, the gate etch 330 may leave some or all of the SiON gate dielectric 316 above the prospective source/drain regions of the substrate 304. The gate mask 328 is then removed and an implant mask 333 is formed in FIG. 5E to expose the active regions of the prospective transistor. A shallow drain extension dopant implantation 334 is performed (162 in FIG. 4) to introduce dopants into source/drain regions 338 as well as into the gate electrode poly-silicon 324. Optionally, a cleaning operation may be employed following the implant 334 to remove any remaining SiON material remaining over the source/drains 338, and to thereby expose a sidewall portion of the gate dielectric 316.

Figure 5F:
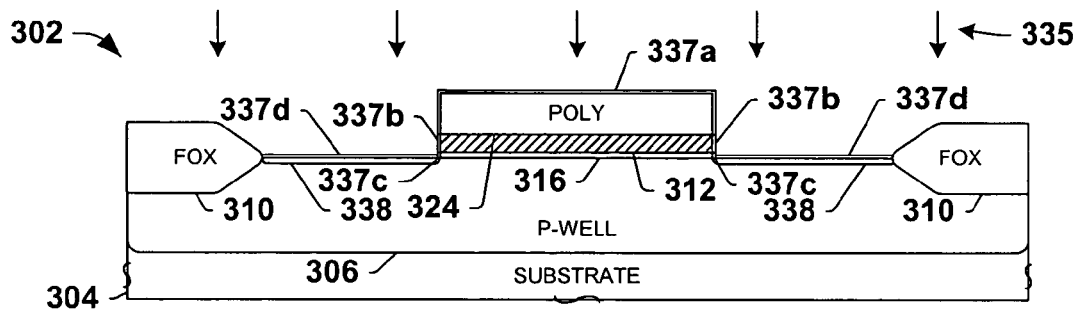
Figure 5G:
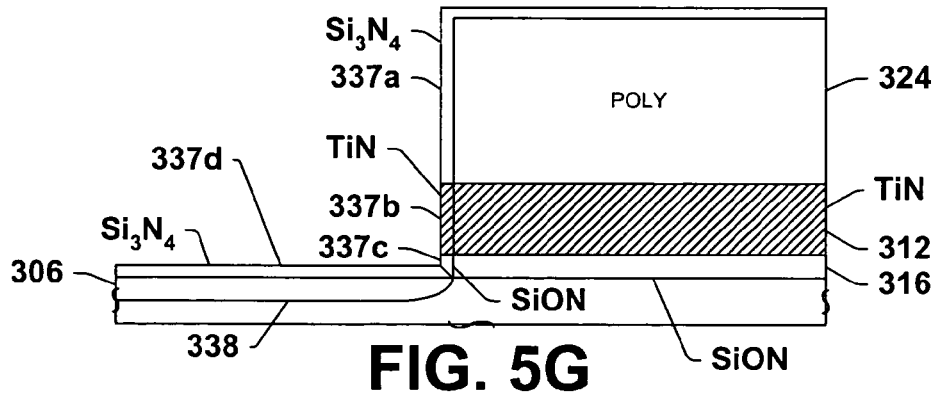

In accordance with the invention, the patterned gate stack is then conditioned and encapsulated in FIGS. 5F–5I. In FIG. 5F, the sidewalls and top of the gate structure are nitrided via a nitridation process 335 (e.g., 164 in FIG. 4) to provide nitrided material 337. As further illustrated in FIG. 5G, the nitridation 335 forms a first silicon nitride 337a (e.g., $Si_3N_4$) at the gate structure top surface and at a portion of the sidewalls along the poly-silicon 324. In addition, the nitridation 335 renitrides the sidewall edge of the metal 312 to form a metal nitride 337b (e.g., TiN), thereby fixing the stoichiometry of the metal 312 which may have been disturbed by the gate etch 330 on FIG. 5D. The nitridation process 335 further fixes the stoichiometry of the gate dielectric 316 by renitriding the SiON dielectric 316, thereby forming a nitrided dielectric SiON 337c at a gate dielectric portion of the sidewalls. The nitridation 335 also forms silicon nitride 337d (e.g., $Si_3N_4$) above the exposed portions of the substrate 304 at the source/drains 338. Any suitable nitridation process 335 may be used within the scope of the invention. In one example, the sidewalls and top of the gate structure are nitrided by exposure to ammonia $NH_3$, at a temperature less than about 1000 degrees C. Alternatively, the nitridation 335 may comprise a decoupled-plasma nitridation (DPN) or a slot plane antenna (SPA) nitridation process.

Figure 5H:
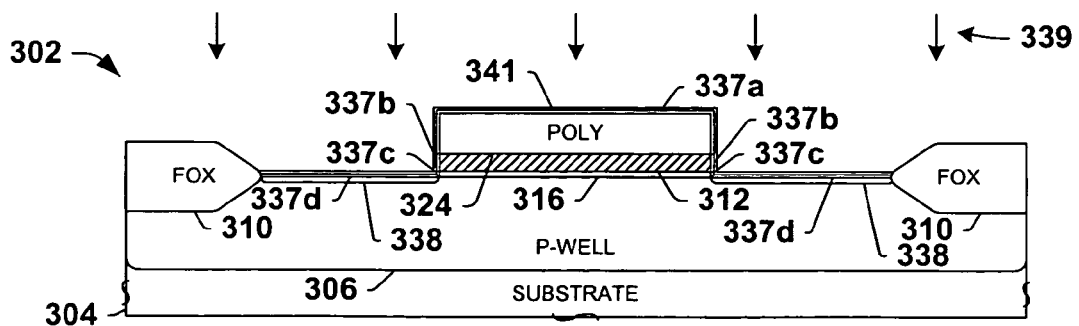
Figure 5I:
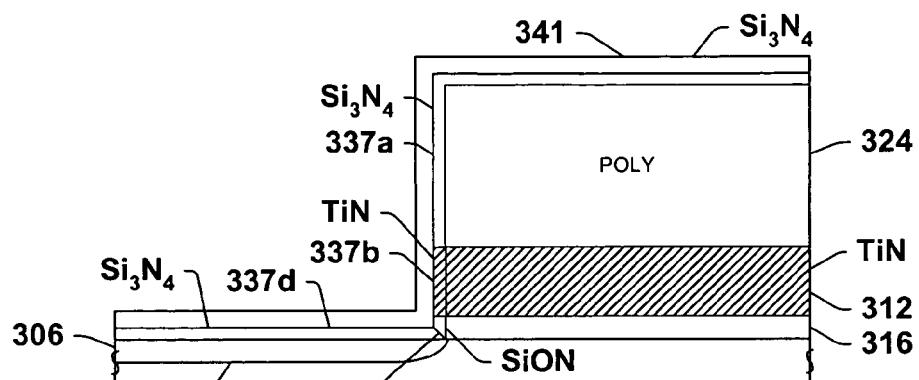

As illustrated in FIGS. 5H and 5I, a silicon nitride encapsulation layer 341 is formed along the top and sidewalls of the nitrided gate structure (166 in FIG. 4), for example, by exposing the sidewalls to ammonia and silane ($SiH_4$) via a process 339. Any process 339 may be used to form the encapsulation layer 341. In the case where the gate sidewalls are nitrided by exposure to ammonia $NH_3$, the encapsulation layer 341 may be deposited by introduction of silane $SiH_4$ into the process, whereby the nitridation 335 and the silicon nitride deposition process 339 may be performed in a single process chamber.

The nitridation 335 and the formation of the encapsulation layer 341 operate to condition the gate sidewalls (e.g., by fixing the stoichiometry of the gate electrode metal 312 and/or of the gate dielectric 316), and also to protect the gate structure from potentially adverse effects of oxidation during subsequent sidewall spacer material deposition. In the exemplary device 302, the gate poly-silicon 324 reacts with nitrogen (e.g., Si+N) during the process 335 to form $Si_3N_4$ 337a along the sidewall and top, and damaged portions of the metal sidewall 312 (e.g., $TiN_x$) are renitrided to form generally stoichiometric TiN 337b. Any exposed dielectric 316, including that damaged by the gate etch 330 (e.g., $SiON_x$) is also renitrided by the process 335 to form stoichiometric SiON 337c. Thereafter, exposure to ammonia and silane forms $Si_3N_4$ 341 or other suitable chemistry set along the exposed $Si_3N_4$ 337a, TiN 337b, and SiON 337c, as illustrated in FIG. 5I.

Figure 5J:
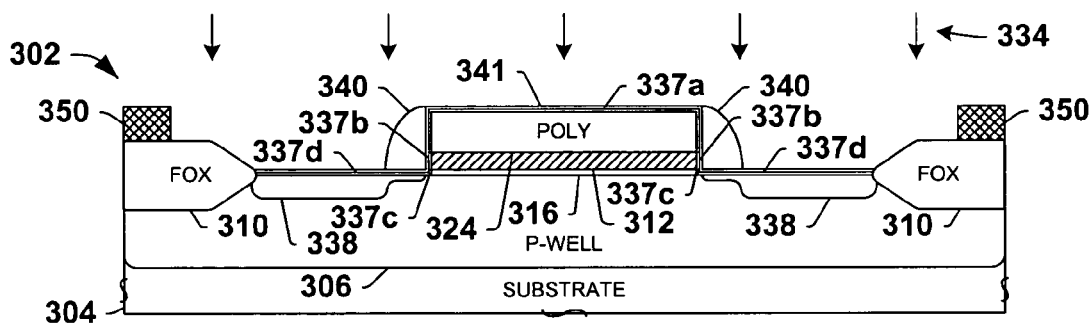
Figure 5K:
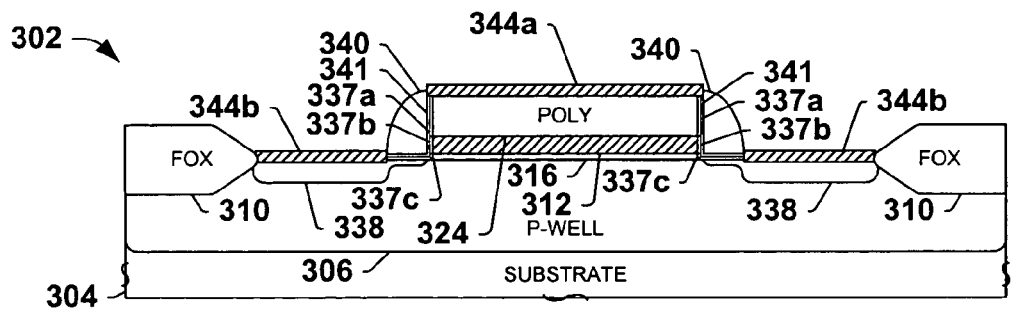
Figure 5L:
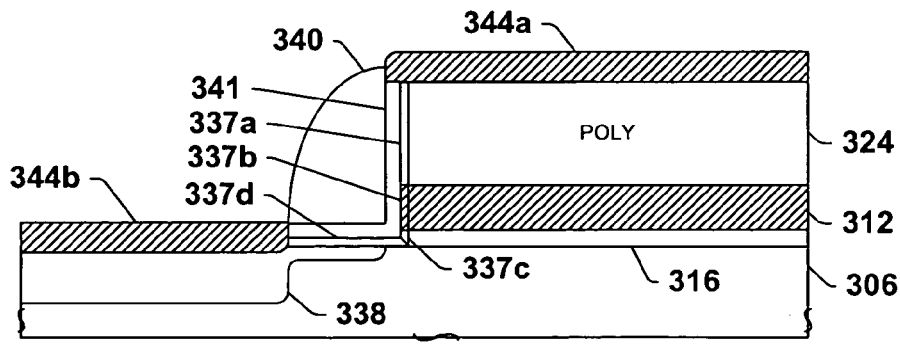

In FIG. 5J, sidewall spacers 340 are formed along the sidewalls of the encapsulated gate structure (168 in FIG. 4) and a source/drain implant mask 350 is formed exposing the active region of the transistor between the isolation structures 310. Dopants are implanted (170 in FIG. 4) to further define the source/drains 338 via an implantation process 334, wherein dopants may also be added to the gate poly-silicon 324. The mask 350 is then removed and the exposed layers 341, 337a, and 337d are removed from the top of the gate poly-silicon 324 and the source/drains 338. Silicide processing is performed (172 in FIG. 4) to form a metal silicide gate contact 344a above the gate poly-silicon 324 and source/drain silicide contacts 344b over the source/drains 338, as illustrated in FIGS. 5K and 5L. Any silicidation processing may be used in accordance with the invention, for example, deposition of nickel over the device 302 and annealing, followed by removal of unreacted nickel. Interconnect metalization and other back-end processing (not shown) may thereafter be performed to complete the fabrication of the device 302 (174 in FIG. 4). In this manner, the device 302 is provided with a silicon nitride encapsulation layer 341 laterally spaced from the sidewall portions of the gate dielectric 316 and the gate electrode materials 312,324, as well as a nitrided dielectric 337c between the encapsulation layer 341 and the gate dielectric 316, and nitrided material 337a, 337b between the encapsulation layer 341 and the sidewall of the gate electrode 312,324 (FIG. 5L).

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A transistor gate structure, comprising:
    a gate dielectric formed above a semiconductor body, the gate dielectric comprising a gate dielectric sidewall;
    a gate electrode above the gate dielectric, the gate electrode comprising a gate electrode sidewall;
    a silicon nitride encapsulation layer laterally spaced from the gate dielectric sidewall and spaced from the gate electrode sidewall;
    sidewall spacers coupled to the silicon nitride encapsulation layer;
    a nitrided dielectric between the silicon nitride encapsulation layer and the gate dielectric sidewall; and
    a nitrided material between the silicon nitride encapsulation layer and the gate electrode sidewall.

2. The gate structure of claim 1, wherein the gate electrode comprises poly-silicon, and wherein the nitrided material comprises silicon nitride between the silicon nitride encapsulation layer and the gate electrode sidewall.

3. The gate structure of claim 2, wherein the gate electrode further comprises metal, metal aluminide, or metal silicide, and wherein the nitrided material further comprises nitrided metal, metal aluminum nitride, or metal silicon nitride between the silicon nitride encapsulation layer and the gate electrode sidewall.

4. The gate structure of claim 1, wherein the gate electrode comprises metal or metal silicide, and wherein the nitrided material comprises nitrided metal, metal aluminum nitride, or metal silicon nitride between the silicon nitride encapsulation layer and the gate electrode sidewall.

5. An encapsulation structure for conditioning and protecting a transistor gate structure having a gate dielectric and a gate electrode, the encapsulation structure comprising:
- a silicon nitride encapsulation layer laterally spaced from a sidewall of the gate structure;
- sidewall spacers coupled to the silicon nitride encapsulation layer;
- a nitrided dielectric between the silicon nitride encapsulation layer and the gate dielectric at the sidewall; and
- a nitrided material between the silicon nitride encapsulation layer and the gate electrode at the sidewall.

* * * * *